(12) United States Patent
Bonecutter

(10) Patent No.: US 10,453,727 B2
(45) Date of Patent: Oct. 22, 2019

(54) ELECTRONIC DEVICE MANUFACTURING LOAD PORT APPARATUS, SYSTEMS, AND METHODS

(71) Applicant: Applied Materials, Inc., Santa Clara, CA (US)

(72) Inventor: Luke W. Bonecutter, Cedar Park, TX (US)

(73) Assignee: Applied Materials, Inc., Santa Clara, CA (US)

( * ) Notice: Subject to any disclaimer, the term of this patent is extended or adjusted under 35 U.S.C. 154(b) by 350 days.

(21) Appl. No.: 15/348,961

(22) Filed: Nov. 10, 2016

(65) Prior Publication Data

US 2018/0130687 A1    May 10, 2018

(51) Int. Cl.
*H01L 21/677* (2006.01)

(52) U.S. Cl.
CPC .. *H01L 21/67772* (2013.01); *H01L 21/67766* (2013.01); *H01L 21/67775* (2013.01); *H01L 21/67778* (2013.01)

(58) Field of Classification Search
CPC ......... H01L 21/67772; H01L 21/67766; H01L 21/67775; H01L 21/67778
See application file for complete search history.

(56) References Cited

U.S. PATENT DOCUMENTS 8,851,195 B2 * 10/2014 Deurloo ................. A62C 35/62
137/467
2003/0031537 A1    2/2003 Tokunaga
2004/0013498 A1    1/2004 Soucy et al.
2006/0204356 A1 *  9/2006 Yamagishi ........ H01L 21/67017
414/749.1
2007/0009345 A1 *  1/2007 Hall .................. H01L 21/67775
414/222.01
2007/0183869 A1    8/2007 Cho et al.
2009/0110518 A1    4/2009 Rice et al.
2012/0247042 A1   10/2012 Clancy et al.
(Continued)

FOREIGN PATENT DOCUMENTS

WO    WO 2015-023591    2/2015

OTHER PUBLICATIONS

Vincent et al., U.S. Appl. No. 15/336,279, titled: Flexible Equipment Front End Module Interfaces, Environmentally-Controlled Equipment Front End Modules, and Assembly Methods, filed Oct. 27, 2016.

(Continued)

*Primary Examiner* — Lynn E Schwenning
*Assistant Examiner* — Ashley K Romano
(74) *Attorney, Agent, or Firm* — Lowenstein Sandler LLP

(57) ABSTRACT

An electronic device manufacturing system includes a factory interface that has a load port. The load port may include a panel having a back surface. The back surface may have a groove extending along an outer portion of the panel. The groove may include a neck region and a flared base region. The neck region may have a rectangular cross section that extends to a flared base region. A bulb seal or a rectangularly-shaped seal may be seated in the groove and may be configured to seal an interface between the load port and the factory interface. Methods of assembling a factory interface for an electronic device manufacturing system are also provided, as are other aspects.

20 Claims, 6 Drawing Sheets

(56) References Cited

U.S. PATENT DOCUMENTS

| | | | |
|---|---|---|---|
| 2014/0363258 A1* | 12/2014 | Iwamoto | H01L 21/67772 414/217 |
| 2015/0024671 A1* | 1/2015 | Taniyama | H01L 21/67017 454/193 |
| 2015/0045961 A1 | 2/2015 | Koshti et al. | |
| 2015/0170945 A1* | 6/2015 | Segawa | H01L 21/67017 414/217 |
| 2015/0221538 A1 | 8/2015 | Ochiai et al. | |
| 2015/0228516 A1* | 8/2015 | Liao | H01L 21/67389 34/443 |
| 2015/0243538 A1* | 8/2015 | Miyajima | H01L 21/67772 206/711 |
| 2016/0147235 A1 | 5/2016 | Rice et al. | |

OTHER PUBLICATIONS

Reuter et al., U.S. Appl. No. 15/348,964, titled: Systems, Apparatus, and Methods for an Improved Load Port Backplane, filed Nov. 10, 2016.

Blahnik et al., U.S. Appl. No. 15/348,947, titled: Electronic Device Manufacturing Load Port Apparatus, Systems, and Methods, filed Nov. 10, 2016.

Luke W. Bonecutter, U.S. Appl. No. 15/348,967, titled: Systems, Apparatus, and Methods for an Improved Load Port, filed Nov. 10, 2016.

International Search Report and Written Opinion of International Application No. PCT/US2017/060966 dated Feb. 19, 2018.

* cited by examiner

ELECTRONIC DEVICE MANUFACTURING LOAD PORT APPARATUS, SYSTEMS, AND METHODS

FIELD

This disclosure relates to electronic device manufacturing and, more particularly, to factory interface load port seals.

BACKGROUND

Processing of substrates in semiconductor electronic device manufacturing is generally carried out in multiple process tools, where substrates travel between process tools in substrate carriers, such as, e.g., Front Opening Unified Pods or FOUPs. A substrate carrier may be docked to a load port of a factory interface, such as, e.g., an Equipment Front End Module or EFEM. A factory interface may include a robot substrate handler operable to transfer substrates between a substrate carrier and a process tool. An environmentally-controlled atmosphere may be provided within and between the substrate carrier and the factory interface and the factory interface and a process tool. Poor control of various environmental factors, such as, e.g., levels of humidity, temperature, oxygen, and/or contaminants/particles may adversely affect substrate properties and substrate processing. Existing electronic device manufacturing systems may therefore benefit from improved environmental control at the factory interface.

Accordingly, improved electronic device manufacturing load port apparatus, systems, and methods are desired.

SUMMARY

According to a first aspect, a load port configured to interface with a substrate carrier and a factory interface of an electronic device manufacturing system is provided. The load port comprises a panel configured to couple to a front side of a housing of the factory interface. The panel has a back surface facing the front side of the housing of the factory interface. The back surface has a groove extending along an outer portion of the panel, the groove comprising a neck region and a flared base region. The neck region has a rectangular cross section that extends to the flared base region. The load port also comprises a seal seated in the groove. The seal is configured to engage the front side of the housing of the factory interface when the panel is coupled to the front side.

According to a second aspect, an electronic device manufacturing system is provided. The electronic device manufacturing system comprises a substrate process tool and a factory interface. The factory interface comprises a housing having a front side and a rear side. The front side has a front side opening, and the rear side is coupled to the substrate process tool. The factory interface also comprises a load port configured to interface with a substrate carrier. The load port comprises a panel coupled to the front side of the factory interface housing at the front side opening of the housing. The panel has a back surface facing the front side of the housing. The back surface has a groove extending along an outer portion of the panel. The groove comprises a neck region and a flared base region. The neck region has a rectangular cross section that extends to the flared base region. The load port also comprises a seal seated in the groove. The seal is configured to engage the front side of the housing when the panel is coupled to the front side.

According to a third aspect, a method of assembling a factory interface for an electronic device manufacturing system is provided. The method comprises providing a load port configured to interface with a substrate carrier, the load port comprising a panel having a back surface. The method also comprises providing the back surface of the panel with a groove extending along an outer portion of the panel. The groove comprises a neck region and a flared base region. The neck region has a rectangular cross section that extends to the flared base region. The method further comprises seating a seal into the groove.

Still other aspects, features, and advantages in accordance with these and other embodiments of the disclosure may be readily apparent from the following detailed description, the appended claims, and the accompanying drawings. Accordingly, the drawings and descriptions herein are to be regarded as illustrative in nature, and not as restrictive.

BRIEF DESCRIPTION OF DRAWINGS

The drawings, described below, are for illustrative purposes only and are not necessarily drawn to scale. The drawings are not intended to limit the scope of the disclosure in any way.

DETAILED DESCRIPTION

Reference will now be made in detail to example embodiments of the disclosure, which are illustrated in the accompanying drawings. Wherever possible, the same reference numbers will be used throughout the drawings to refer to the same or like parts.

Electronic device manufacturing may involve maintaining and/or providing controlled environments between various components, such as, e.g., substrate carriers, load ports, factory interfaces, and process tools in order to reduce undesirable humidity, temperature, oxygen, and/or contaminant/particle levels that may adversely affect substrate properties and/or substrate processing. Interfaces between the components may include various seals. Some of these seals may be subjected to horizontal and/or vertical component shifts while under compression during, e.g., a maintenance procedure and/or a leveling or positional adjustment of one component relative to another component. Such component shifts may damage a seal and/or cause a seal to tear and/or detach from its component, which may adversely affect its sealing capability.

In one aspect, electronic device manufacturing systems in accordance with one or more embodiments of the disclosure include improved load port seals. The improved load port seals in some embodiments may employ a particularly shaped and/or dimensioned groove extending along an outer portion of a back surface of a panel of a load port. The back surface may be configured to interface with a front side of a factory interface. Seals of certain shapes, dimensions, and/or materials in accordance with one or more embodiments may be seated in the groove. The groove and seal configurations described herein may reduce or eliminate the possibility of a seal being damaged, torn, and/or detached during component shifts. The groove and seal configurations described herein may also have other advantages, such as, e.g., ease of installation and removal and effective sealing at non-uniform compressions.

Further details of example embodiments illustrating and describing the improved load port seals, as well as other aspects including methods of assembling a factory interface for an electronic device manufacturing system, will be explained in greater detail below in connection with FIGS. 1-6.

Figure 1:
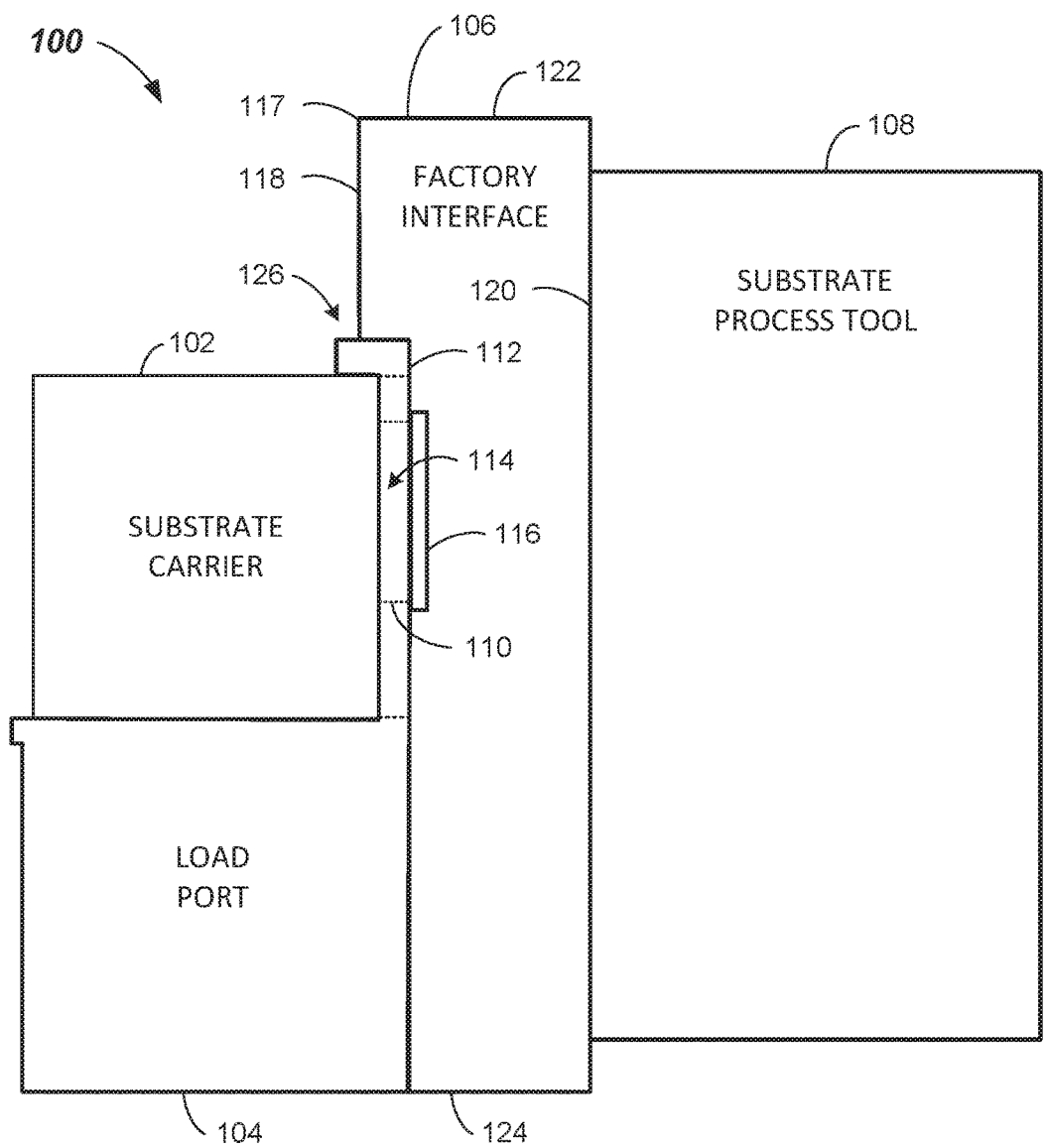
FIG. 1 illustrates a side schematic view of an electronic device manufacturing system according to embodiments of the disclosure.

FIG. 1 illustrates a side schematic view of an electronic device manufacturing system 100 in accordance with one or more embodiments. Electronic device manufacturing system 100 may include a substrate carrier 102, a load port 104, a factory interface 106, and a substrate process tool 108. Load port 104 may be coupled to factory interface 106, which may be coupled to substrate process tool 108. In some embodiments, equipment (e.g., gas supply lines, vacuum pumps, etc., not shown) within and/or coupled to electronic device manufacturing system 100 may place one or more of substrate carrier 102, load port 104, factory interface 106, and substrate process tool 108 in an environmentally-controlled atmosphere (e.g., in a non-reactive and/or inert gas environment, under vacuum, or the like) depending on the open or closed state of doors, door openers, gate/slit valves, or similar mechanisms at the interfaces thereof.

Substrate carrier 102 may be configured to carry one or more substrates. Substrates may be any suitable article used to make electronic devices or circuit components, such as silicon-containing discs or wafers, patterned wafers, glass plates, or the like. Substrate carrier 102 may be, e.g., a Front Opening Unified Pod or FOUP in some embodiments, and may include a carrier door 110.

Load port 104 may be configured to receive substrate carrier 102 thereon. Load port 104 may have a panel 112 having a panel opening 114 configured to receive carrier door 110 therein. Load port 104 may also have a carrier door opener 116 configured to contact (that is, e.g., latch onto or otherwise attach to) carrier door 110 and open carrier door 110 to allow the transfer of substrates into and out of substrate carrier 102. In some embodiments, carrier door opener 116 may contact carrier door 110, move carrier door 110 inward (i.e., to right as shown in FIG. 1) enough to clear panel 112, and then move carrier door 110 downward to provide access into substrate carrier 102.

Factory interface 106 may be any suitable enclosure having a housing 117 that has a front side 118, a rear side 120, a top 122, a bottom 124, and two side walls (not separately shown). Front side 118 may have one or more front side openings 126 configured to receive and couple to a respective load port 104. Factory interface 106 may include a robot substrate handler (not shown) configured to transfer substrates from substrate carrier 102 through factory interface 106 to substrate process tool 108.

Substrate process tool 108 may perform one or more processes, such as, e.g., physical vapor deposition (PVD), chemical vapor deposition (CVD), etching, annealing, pre-cleaning, metal or metal oxide removal, or the like, on one or more substrates. Other processes may be carried out on substrates therein. Substrate process tool 108 may include one or more load lock chambers, a transfer chamber, and one or more process chambers (none shown). The one or more load lock chambers may be coupled to factory interface 106, while the transfer chamber may be coupled to the one or more load lock chambers and to the one or more process chambers. The robot substrate handler of factory interface 106 may transfer substrates into and out of the one or more load lock chambers. Substrate process tool 108 may include a transfer robot (not shown) at least partially housed within the transfer chamber. The transfer robot may be configured to transfer substrates to and from the one or more load lock chambers and the one or more process chambers.

Figure 2:
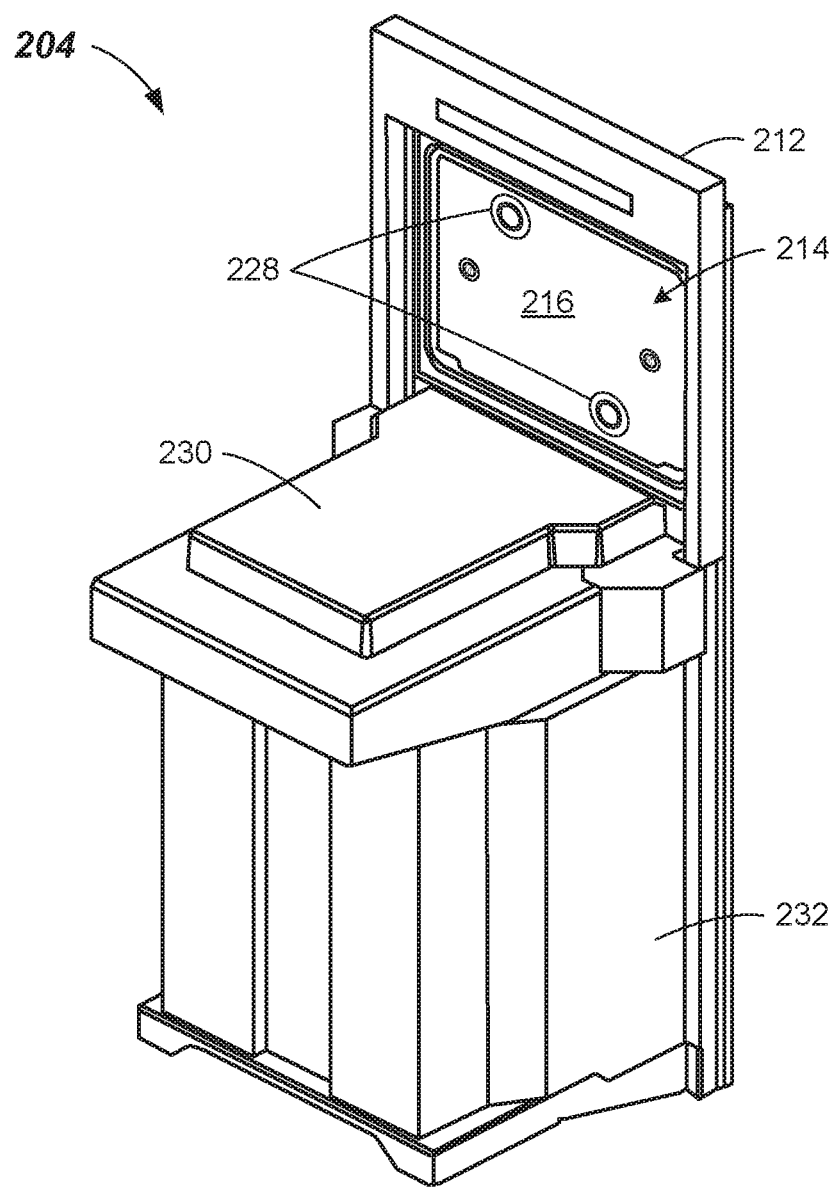
FIG. 2 illustrates a front perspective view of a load port according to embodiments of the disclosure.

FIG. 2 illustrates a front perspective view of a load port 204 in accordance with one or more embodiments. In some embodiments, load port 204 may be identical or similar to load port 104. Load port 204 may include a panel 212 having a panel opening 214. Load port 204 may also include a carrier door opener 216 that seals panel opening 214 when carrier door opener 216 is closed against panel 212. Carrier door opener 216 may have one or more connectors 228 configured to contact and attach to carrier door 110 of substrate carrier 102. Connectors 228 may be, e.g., suction type devices, vacuum devices, etc. Other suitable types of connector devices capable of attaching to carrier door 110 may be used. A mounting table 230 may be provided that extends outward from panel 212. Mounting table 230 may be configured to receive substrate carrier 102 thereon. Various mechanisms (not shown) may be included on and/or around mounting table 230 to lock substrate carrier 102 into a proper position on mounting table 230. Load port 204 may further include a lower portion 232 that may house an opening/closing mechanism (not shown in FIG. 2) coupled to carrier door opener 216 that, in some embodiments, may attach carrier door opener 216 to carrier door 110 and open carrier door 110 as described above in connection with FIG. 1.

Figure 3:
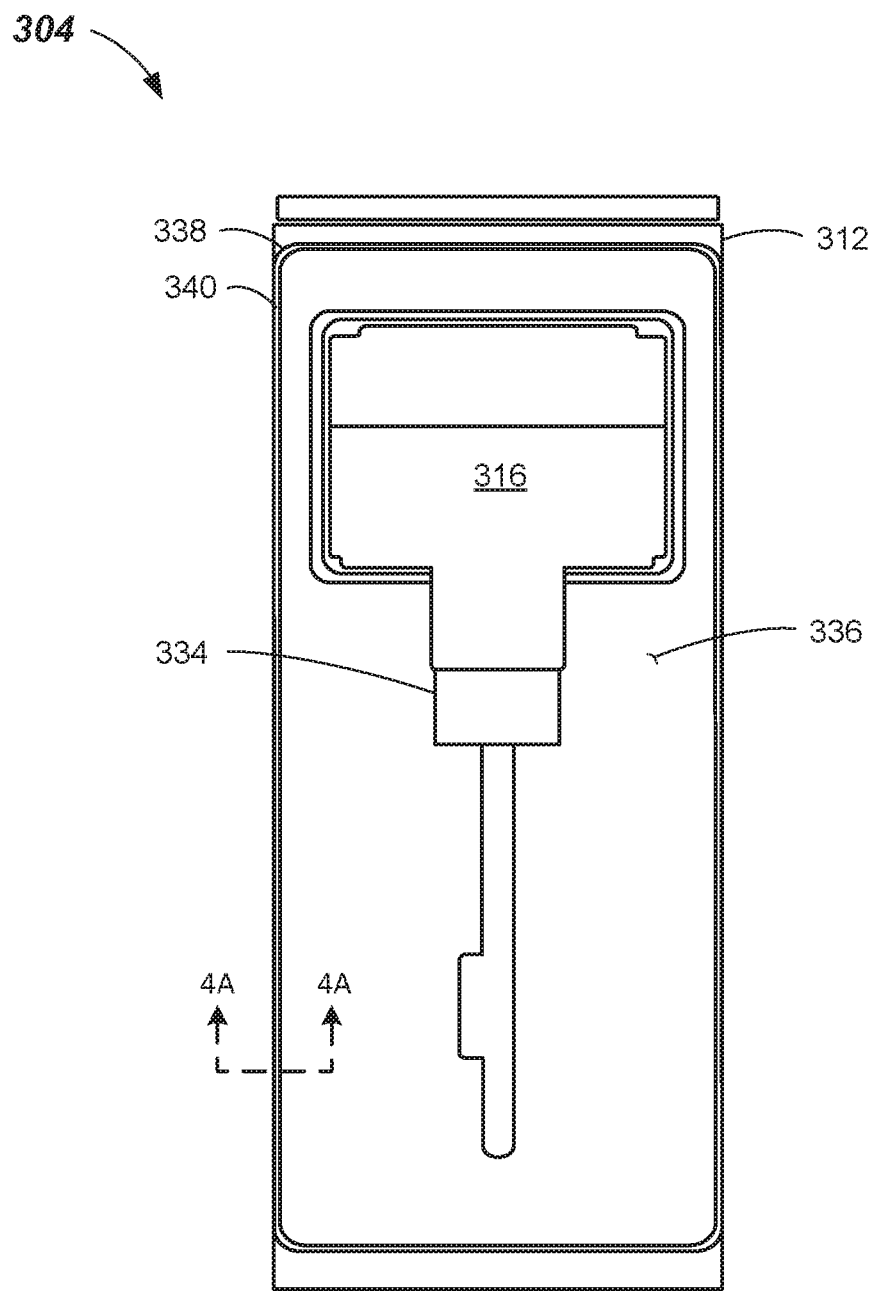
FIG. 3 illustrates a simplified rear elevational view of a load port according to embodiments of the disclosure.

FIG. 3 illustrates a rear view of a load port 304 in accordance with one or more embodiments. In some embodiments, load port 304 may be identical or similar to load ports 104 and/or 204. Load port 304 may include a panel 312 and a carrier door opener 316 that seals a panel opening (not shown in FIG. 3) when carrier door opener 316 is closed against panel 312. Load port 304 may further include an opening/closing mechanism 334 (partially shown in FIG. 3) that may open and close carrier door opener 316 as described above in connections with FIGS. 1 and/or 2. Panel 312 may have a back surface 336 that has a groove 338 extending around an outer portion and/or a periphery of panel 312. In some embodiments, groove 338 may be about 1.5 to 5.0 mm from the outer side edges of panel 312, and about 20 to 25 mm from the top and/or bottom edges of panel 312. Other groove locations may be used. Back surface 336 may face a front side of a factory interface, such as, e.g., front side 118 of factory interface 106 (FIG. 1), when load port 304 is coupled to a factory interface. A seal

340 may be seated in groove 338. Seal 340 may seal the interface between load port 304 and a factory interface, such as factory interface 106, when load port 304 and the factory interface are coupled together.

Figure 4A:
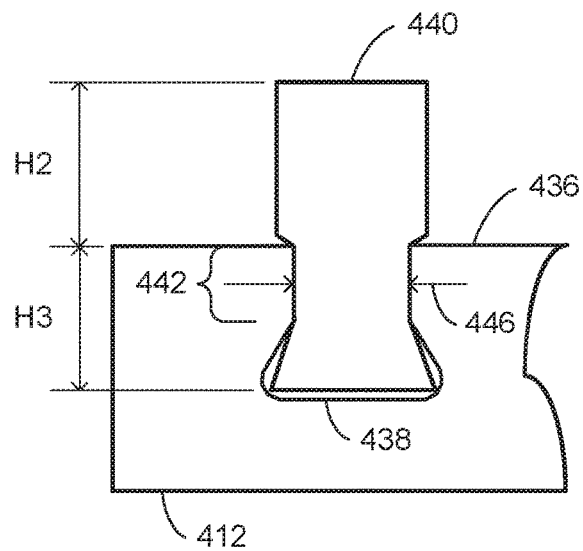
FIG. 4A illustrates a partial cross-sectional view of a seal in a groove of a panel of a load port taken along section line 4A-4A of FIG. 3 according to embodiments of the disclosure.
Figure 4B:
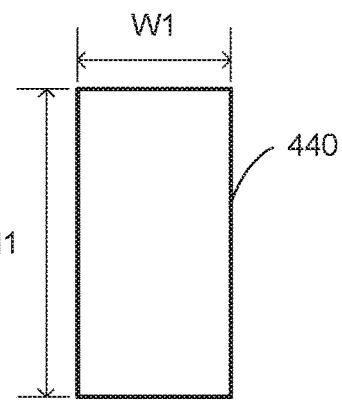
FIG. 4B illustrates of a cross-sectional view of the seal of FIG. 4A according to embodiments of the disclosure.

FIG. 4A illustrates a seal 440 seated in a groove 438 of a back surface 436 of a panel 412 of a load port in accordance with one or more embodiments. In some embodiments, groove 438 may be identical or similar to groove 338 of FIG. 3 and, in some embodiments, seal 440 may be identical or similar to seal 340 of FIG. 3. In one or more embodiments, seal 440 may be made of an EPDM (ethylene propylene diene monomer) foam material and may have an uncompressed rectangular cross-sectional shape prior to insertion in groove 438, as shown in FIG. 4B. Seal 440 may have, in some embodiments, an uncompressed height H1 of about 9.9 to 12.1 mm and an uncompressed width W1 of about 4.5 to 5.5 mm. Seal 440 may have a height-to-width ratio of about 2.0 to 2.4. As seated in groove 438 (FIG. 4A), seal 440 may have in some embodiments an uncompressed above-the-groove height H2 of about 6.1 to 7.5 mm and an inserted height H3 of about 3.8 to 4.6 mm. In one or more embodiments, seal 440 may have an uncompressed height H1 of about 10.5 to 11.5 mm and an uncompressed width W1 of about 4.7 to 5.2 mm. Seal 440 may have a height-to-width ratio ranging from about 2.1 to 2.3. As seated in groove 438 (FIG. 4A), seal 440 may have in some embodiments an uncompressed above-the-groove height H2 of about 6.5 to 7.1 mm and an inserted height H3 of about 4.0 to 4.4 mm. Seal 440 seated in groove 438 may have a maximum inserted height H3 ranging from about 35 to 40% of its height H1.

Figure 4C:
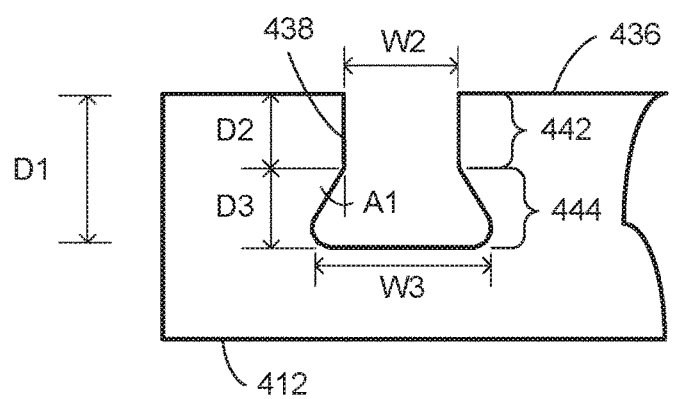
FIG. 4C illustrates a partial cross-sectional view of the groove of FIG. 4A according to embodiments of the disclosure.

FIG. 4C illustrates groove 438 without seal 440 seated therein. In some embodiments, groove 438 may have a depth D1 ranging from about 3.8 to 4.6 mm, and in some embodiments about 4.0 to about 4.4 mm. Groove 438 may have a neck region 442 and a flared base region 444. Neck region 442 may have a rectangular cross section that extends to flared base region 444. In some embodiments, neck region 442 may have a width W2 of about 3.2 to 3.8 mm and a depth D2 of about 1.8 to 2.2 mm. In some embodiments, neck region 442 may have a width W2 of about 3.3 to 3.7 mm and a depth D2 of about 1.9 to 2.1 mm. In some embodiments, flared base region 444 may have a width W3 of about 5.0 to 6.1 mm and a depth D3 of about 2.0 to 2.4 mm. In some embodiments, flared base region 444 may have a width W3 of about 5.3 to 5.9 mm and a depth D3 of about 2.1 to 2.3 mm. In one or more embodiments, a ratio of groove depth D1 to neck region depth D2 may be about 1.8 to 2.2, a ratio of flared base region width W3 to neck region width W2 may be about 1.4 to 1.8, and/or a ratio of groove depth D1 to neck region width W2 may be about 1 to 1.35. In some embodiments, a ratio of groove depth D1 to neck region depth D2 may be about 1.9 to 2.1, a ratio of flared base region width W3 to neck region width W2 may be about 1.5 to 1.7, and/or a ratio of groove depth D1 to neck region width W2 may be about 1.1 to 1.3. In some embodiments, flared base region 444 may have a side wall angle A1 ranging from about 30 degrees to 35 degrees. Side wall angles exceeding 35 degrees may reduce the effectiveness of groove 338 in retaining seal 440 during lateral loads. Other suitable groove dimensions and/or ratios may be used.

Returning to FIG. 4A, neck region 442 may be configured to compress the rectangular cross section of seal 440 in neck region 442 by about 27 to 33% in some embodiments, and by about 28 to 31% in some embodiments, when seal 440 is seated in groove 438, as illustrated via arrows 446. This neck compression in combination with the groove-depth-D1 to neck-region-width-W2 ratio ranging from about 1.1 to 1.3 in some embodiments may be an advantageous tradeoff between seal retention within groove 438 and ease of installing/removing seal 440. Other suitable compression amounts/ratios may be used.

The configurations of groove 338 and seal 440 may advantageously allow seal 440 to expand out into flared base region 444. This expansion may push against the walls of flared base region 444 and may assist in holding seal 440 in place. During vertical and horizontal shear loads, the walls of neck region 442 may provide better support of seal 440 than other known grooves having only a rectangular cross section, a typical dovetail cross section, and/or a combination rectangular-dovetail cross section. For example, a vertical shear load on a seal in groove having only a rectangular cross section may create a spring effect in the seal causing the seal to back out of the groove upon removal of the horizontal shear force. Similarly, a horizontal shear load on a seal in a groove having a typical dovetail cross section may cause the seal to pinch and fold allowing the seal to pop out of the groove. In some embodiments, the portion of seal 440 that extends outside of groove 338 may have a larger width than the portion of seal 440 that resides within groove 338.

Figure 4D:
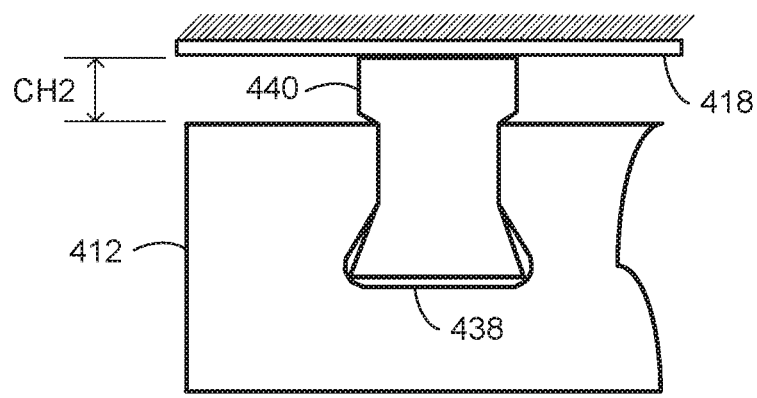
FIG. 4D illustrates a partial cross-sectional view of the seal and groove of FIG. 4A wherein a front side of a factory interface engages the seal according to embodiments of the disclosure.

FIG. 4D illustrates the compression of seal 440 when the load port of panel 412 is coupled to a factory interface having a front side 418 of a housing of the factory interface. As shown, seal 440 may engage front side 418 and may compress in some embodiments by about 31 to 38%, and in some embodiments by about 33 to 36%, upon coupling of the load port to the factory interface. In some embodiments, seal 440 may have a compressed above-the-groove height CH2 of about 2.7 to 3.3 mm, and in some embodiments by about 2.8 to 3.1 mm. In some embodiments, the above-the-groove height CH2 of seal 440 may be configured to be compressed by about 50 to 60%, and in some embodiments by about 52 to 57%, via engagement with front side 418. Other suitable compression amounts/ratios may be used.

Figure 5:
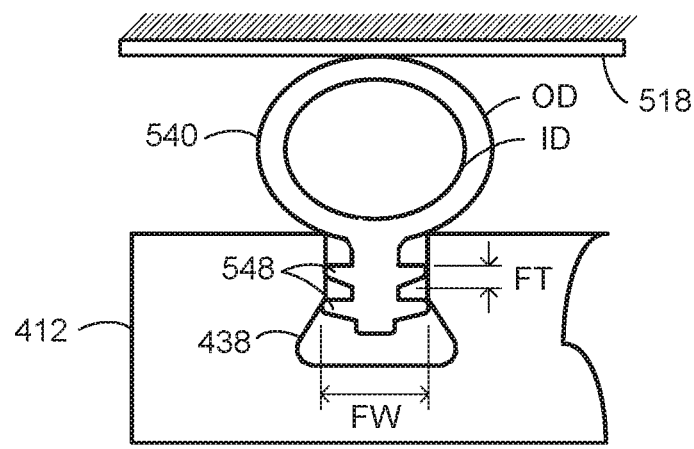
FIG. 5 illustrates a partial cross-sectional view of an alternative seal and the groove of FIG. 4A wherein a front side of a factory interface engages the alternative seal according to embodiments of the disclosure.

FIG. 5 illustrates an alternative seal 540 seated in groove 438 of panel 412. As shown, alternative seal 540 may be compressed via engagement with a front side 518 of a housing of a factory interface. Alternative seal 540 may be a bulb seal with retention fingers 548 (only two are labeled). Other numbers of retention fingers may be used. Retention fingers 548 may be seated in groove 438. In some embodiments, alternative seal 540 may be an FKM (fluoroelastomer) extruded bulb seal with retention fingers. In some embodiments, alternative seal 540 may have an uncompressed outside diameter OD of about 8.2 to 10 mm, an uncompressed inside diameter ID of about 6.2 to 7.6 mm, an uncompressed length of about 12.3 to 15 mm, a finger width FW of about 3.7 to 4.5 mm, and/or a finger thickness FT of about 0.9 to 1.1 mm. In some embodiments, alternative seal 540 may have an uncompressed outside diameter OD of about 8.6 to 9.6 mm, an uncompressed inside diameter ID of about 6.5 to 7.2 mm, an uncompressed length of about 13 to 14.4 mm, a finger width FW of about 3.9 to 4.3 mm, and/or a finger thickness FT of about 0.95 to 1.05 mm. In some embodiments, alternative seal 540 may perform somewhat better than seal 440 in terms of sealing capability, but may have a higher cost.

The configurations of groove 438 and seal 440 and/or seal 540 may advantageously provide effective sealing in situations where compression of seal 440 and/or 540 is non-uniform. That is, despite a non-uniform compression of the seal 440 and/or 540, the seal 440 and/or 540 maintains an appropriate level of environmental isolation between the factory interface and load port/substrate carrier (e.g., environmental sealing that reduces and/or prevents room air, oxygen, etc., from entering the factory interface through the load port/factory interface seal location so that less than a predetermined level of room air, oxygen, etc., may be maintained within the factory interface). For example, to level some load ports, more compression of a seal may occur at the top of a load port's panel than at the bottom of the load port's panel (or vice versa) when the load port is coupled to a factory interface. In some embodiments, a seal compression of about 55 to 65% may occur at the top of a panel (e.g., where the load port and factory interface are coupled) while a seal compression of 25 to 35% may occur at the bottom of the panel. Similarly, non-uniform seal compressions may occur between a left side and a right side of a panel of a load port coupled to a factory interface. The grooves and seals described herein may advantageously provide effective sealing in those situations.

Figure 6:
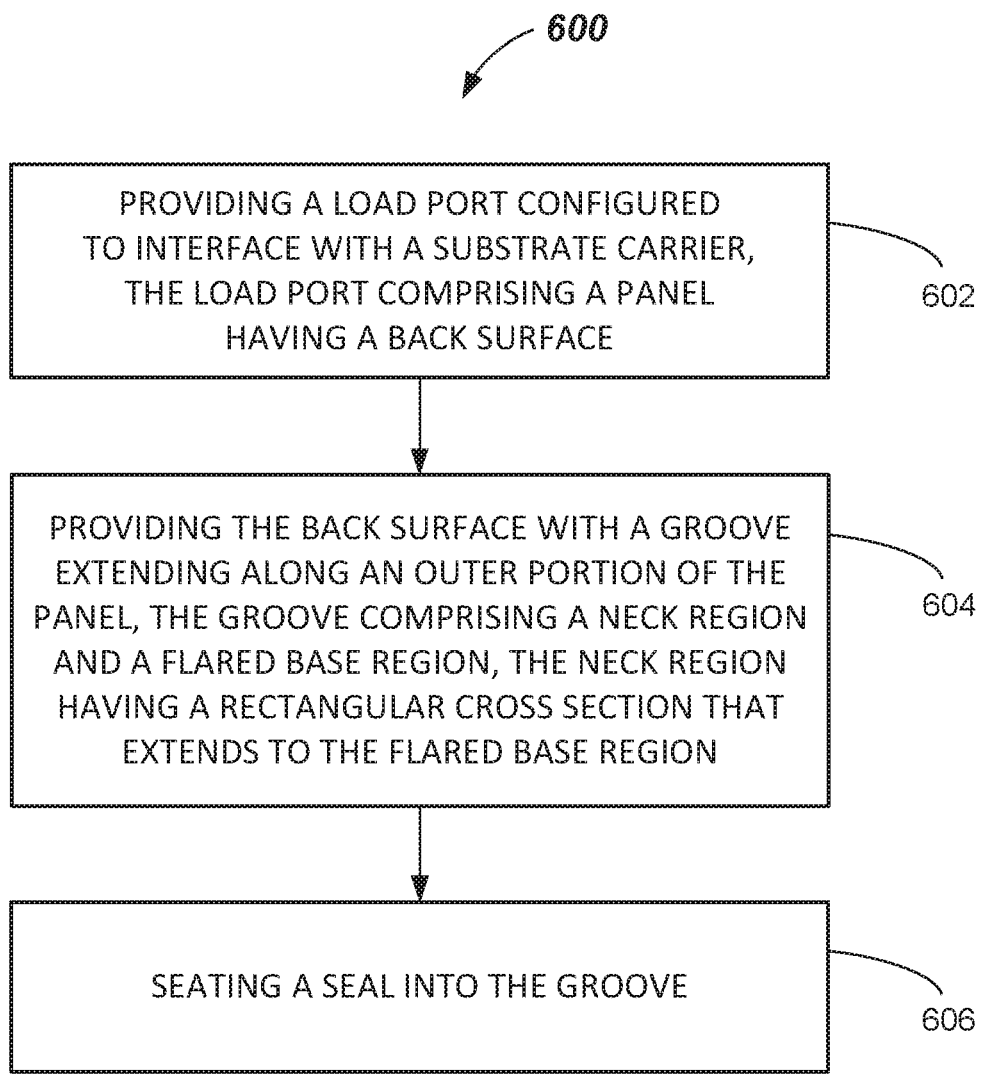
FIG. 6 illustrates a method of assembling a factory interface for an electronic device manufacturing system according to embodiments of the disclosure.

FIG. 6 illustrates a method 600 of assembling a factory interface for an electronic device manufacturing system in accordance with one or more embodiments. At process block 602, method 600 may include providing a load port configured to interface with a substrate carrier, the load port comprising a panel having a back surface. For example, referring to FIG. 3, load port 304 may be provided that is configured to interface with a substrate carrier, such as, substrate carrier 102 (FIG. 1). Load port 304 may have a panel 312 that has a back surface 336.

At process block 604, the back surface of the panel may be provided with a groove extending along an outer portion of the panel, the groove comprising a neck region and a flared base region, the neck region having a rectangular cross section that extends into the flared base region. As shown in FIGS. 4A and 4C, e.g., back surface 436 may have a groove 438 that comprises neck region 442 and flared base region 444, wherein neck region 442 has a rectangular cross section that extends into flared base region 444.

And at process block 606, method 600 may include seating a seal into the groove. For example, seal 440 may be seated into groove 438, as shown in FIG. 4A.

The foregoing description discloses only example embodiments of the disclosure. Modifications of the above-disclosed apparatus, systems, and methods may fall within the scope of the disclosure. Accordingly, while example embodiments of the disclosure have been disclosed, it should be understood that other embodiments may fall within the scope of the disclosure, as defined by the following claims.

What is claimed is:

1. A load port configured to interface with a substrate carrier and a factory interface of an electronic device manufacturing system, the load port comprising:
a panel configured to couple to a front side of a housing of the factory interface, the panel having a back surface facing the front side of the housing, the back surface having a groove extending along an outer portion of the panel, the groove comprising a neck region and a flared base region, the neck region having a rectangular neck region width, the flared base region having a base width that is wider than the neck region width, wherein the neck region extends to the flared base region; and
a seal seated in the groove, the seal configured to engage the front side of the housing when the panel is coupled to the front side, and the seal comprising a neck portion proximate the neck region and a flared base portion proximate the flared base region when seated in the groove.

2. The load port of claim 1, wherein the groove extends along an outer periphery of the panel.

3. The load port of claim 1, wherein the groove has a depth-to-neck-region-width ratio ranging from about 1.1 to 1.3.

4. The load port of claim 1, wherein the groove has a depth ranging from about 3.8 to 4.6 mm, the neck region width ranging from about 3.2 to 3.8 mm, and a neck region depth ranging from about 1.8 to 2.2 mm.

5. The load port of claim 1, wherein the flared base region has a side wall angle ranging from about 30 to 35 degrees.

6. The load port of claim 1, wherein the seal has a rectangular cross section when not seated in the groove and the neck region of the groove is configured to compress the rectangular cross section of the neck portion of the seal by about 27 to 33% when the seal is seated in the groove.

7. The load port of claim 1, wherein the seal has a rectangular cross section and a height-to-width ratio ranging from about 2.0 to 2.4 when not seated in the groove.

8. The load port of claim 1, wherein the seal has a height and a maximum of about 35 to 40% of the height is seated in the groove.

9. The load port of claim 1, wherein the seal has an above-the-groove height when seated in the groove, the above-the-groove height of the seal configured to be compressed by about 50 to 60% when the panel is coupled to the front side.

10. The load port of claim 1, wherein the seal is comprised of EPDM (ethylene propylene diene monomer) foam.

11. The load port of claim 1, wherein the seal comprises an FKM (fluoroelastomer) extruded bulb seal with retention fingers.

12. A factory interface of an electronic device manufacturing system, the factory interface comprising:
the load port of claim 1; and
a housing having a front side and a rear side, the front side coupled to the load port and the rear side configured to be coupled to a substrate process tool.

13. An electronic device manufacturing system, comprising:
a substrate process tool; and
a factory interface comprising:
a housing having a front side and a rear side, the front side having a front side opening and the rear side coupled to the substrate process tool; and
a load port configured to interface with a substrate carrier, the load port comprising:
a panel coupled to the front side at the front side opening of the housing, the panel having a back surface facing the front side of the housing, the back surface having a groove extending along an outer portion of the panel, the groove comprising a neck region and a flared base region, the neck region having a neck region width, the flared base region having a base width dimension that is wider than the neck region width, wherein the neck region extends to the flared base region; and
a seal seated in the groove, the seal configured to engage the front side of the housing when the panel is coupled to the front side, and the seal comprising a neck portion and flared base portion when seated in the groove.

14. The electronic device manufacturing system of claim 13, wherein, the groove has a depth-to-neck-region-width ratio ranging from about 1.1 to 1.3, or the flared base region has a side wall angle ranging from about 30 to 35 degrees.

15. The electronic device manufacturing system of claim 13, wherein the seal provides effective sealing between the load port and the housing in response to a non-uniform compression of the seal against the front side of the housing.

16. The electronic device manufacturing system of claim 13, wherein, the seal has a rectangular cross section when not seated in the groove and the neck region of the groove is configured to compress the rectangular cross section of the seal by about 27 to 33% when the seal is seated in the groove.

17. The electronic device manufacturing system of claim 13, wherein the seal has a rectangular cross section and a height-to-width ratio ranging from about 2.0 to 2.4 when not seated in the groove.

18. A method of assembling a factory interface for an electronic device manufacturing system, the method comprising:

providing a load port configured to interface with a substrate carrier, the load port comprising a panel having a back surface;

providing the back surface of the panel with a groove extending along an outer portion of the panel, the groove comprising a neck region and a flared base region, the neck region having a neck region width, the flared base region having a base width dimension that is wider than the neck region width, wherein the neck region extends to the flared base region; and seating a seal into the groove, the seal comprising a neck portion and flared base portion when seated in the groove.

19. The method of claim 18, further comprising providing the groove with a depth-to-neck-region-width ratio ranging from about 1.1 to 1.3.

20. The method of claim 18, further comprising providing the seal with a rectangular cross section when not seated in the groove and a height-to-width ratio ranging from about 2.0 to 2.4.

\* \* \* \* \*

UNITED STATES PATENT AND TRADEMARK OFFICE
CERTIFICATE OF CORRECTION

PATENT NO. : 10,453,727 B2
APPLICATION NO. : 15/348961
DATED : October 22, 2019
INVENTOR(S) : Luke W. Bonecutter Page 1 of 1

It is certified that error appears in the above-identified patent and that said Letters Patent is hereby corrected as shown below:

In the Claims

In Claim 1, Column 7, Line 58, delete "rectangular"

Signed and Sealed this
Fifth Day of May, 2020

Andrei Iancu
*Director of the United States Patent and Trademark Office*